United States Patent [19]

Hiskes et al.

[11] Patent Number: 5,077,271

[45] Date of Patent: Dec. 31, 1991

[54] LIQUID PHASE EPITAXIAL METHOD FOR FORMING SINGLE CRYSTAL FILMS OF HIGH TEMPERATURE OXIDE SUPERCONDUCTORS

[75] Inventors: Ronald Hiskes, Palo Alto; Martha L. Narbut, San Mateo, both of Calif.

[73] Assignee: Hewlett-Packard Company, Palo Alto, Calif.

[21] Appl. No.: 278,880

[22] Filed: Dec. 2, 1988

[51] Int. Cl.$^5$ .......................... C30B 15/30; B05D 5/12
[52] U.S. Cl. ......................................... 505/1; 156/621; 156/624; 423/593; 505/729
[58] Field of Search ................. 156/621, 624; 423/593; 505/1, 729

[56] References Cited

U.S. PATENT DOCUMENTS

| | | | |
|---|---|---|---|
| 4,793,894 | 12/1988 | Jacco et al. | 156/621 |
| 4,824,826 | 4/1989 | Damento et al. | 252/521 |
| 4,956,334 | 9/1990 | Oka et al. | 505/1 |
| 4,973,574 | 11/1990 | Nishio et al. | 505/1 |
| 4,996,186 | 2/1991 | Wang et al. | 505/729 |

OTHER PUBLICATIONS

Oka et al., Jap. Jour. Appl. Phys. 26, (Oct. 1987) L-1590.
Picone et al., in MRS-Symp. Proc. #99 Nov.-Dec. 1987, ed. Brodsky et al., p. 279.
Hasegawa et al., Jap. Jour. Appl. Phys. 26 (May 1987), p. L-673.
Takekawa et al., Ibid, 26 (May 1987) L-851.
Hayashi et al., Ibid, 27 (Sep. 1988) L-1646.
Das et al., Jour. Crystal Growth 85 (Dec. 1987) 588.
Wanklyn et al., Solid St. Comm. 66 (4) 1988, p. 441.
Thompson et al., in High $T_c$ Superconductors II, ed. Capone et al., MRS-Symp., Apr. '88.
Katsui et al., Jour. Crystal Growth, 91 (Aug. 1988) 261.
Campa et al., Ibid, 91 (Aug. 1988) 334.
Kaiser et al., Ibid, 85 (Dec. 1987) 593.
Hiskes, R., "LPE Growth and Characterization of Magnetic Garnets Grown in BaO-Based Solvents", *Journal of Crystal Growth*, vol. 27, 1974, pp. 287-298.
D. E. Farrell and B. S. Chandrasekhar, "Superconducting Properties of Aligned Crystalline Grains of $Y_1Ba_2CU_3O_{7-67}$" The American Physical Society, vol. 36, No. 7, pp. 4025-4027.
Claudia P. Ostertag et al., "Alignment of Superconducting Grains by Magnetic Casting", Ceramic Superconductors II, Ed. by F. Yan, American Ceramics Society, Westerville, Ohio (1988), p. 332 [papers presented at the Symposium on High $T_c$ Superconductors, Cincinnati, May 1988].

*Primary Examiner*—Upendra Roy

[57] ABSTRACT

A method is disclosed for forming a thin film of an oxide based superconductor on a substrate, which is preferably a substrate comprising superconducting material, which comprises forming an oxide based solvent, dissolving in the solvent a stoichiometric amount of compounds capable of forming a superconducting material to form a molten solution, maintaining the molten solution at a temperature of from about 400° to about 1000° C., immersing a substrate into the resulting molten solution, epitaxially growing a thin film of a superconductor crystal on the substrate, and bubbling a source of oxygen through the molten solution during the epitaxial growth of the thin film superconductor crystal.

23 Claims, 1 Drawing Sheet

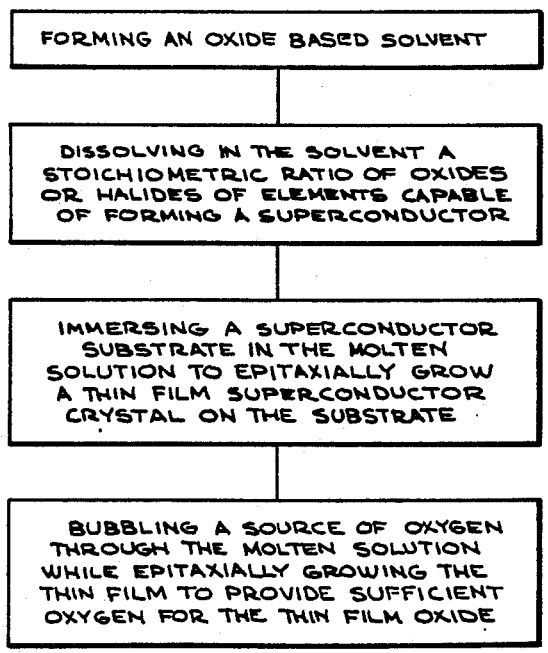

```
┌─────────────────────────────────────┐
│   FORMING AN OXIDE BASED SOLVENT    │
└─────────────────┬───────────────────┘
                  │
┌─────────────────┴───────────────────┐
│   DISSOLVING IN THE SOLVENT A       │
│   STOICHIOMETRIC RATIO OF OXIDES    │
│   OR HALIDES OF ELEMENTS CAPABLE    │
│   OF FORMING A SUPERCONDUCTOR       │
└─────────────────┬───────────────────┘
                  │
┌─────────────────┴───────────────────┐
│   IMMERSING A SUPERCONDUCTOR        │
│   SUBSTRATE IN THE MOLTEN           │
│   SOLUTION TO EPITAXIALLY GROW      │
│   A THIN FILM SUPERCONDUCTOR        │
│   CRYSTAL ON THE SUBSTRATE          │
└─────────────────┬───────────────────┘
                  │
┌─────────────────┴───────────────────┐
│   BUBBLING A SOURCE OF OXYGEN       │
│   THROUGH THE MOLTEN SOLUTION       │
│   WHILE EPITAXIALLY GROWING THE     │
│   THIN FILM TO PROVIDE SUFFICIENT   │
│   OXYGEN FOR THE THIN FILM OXIDE    │
└─────────────────────────────────────┘
```

LIQUID PHASE EPITAXIAL METHOD FOR FORMING SINGLE CRYSTAL FILMS OF HIGH TEMPERATURE OXIDE SUPERCONDUCTORS

BACKGROUND OF THE INVENTION

1. Field of the Invention

This invention relates to a method of forming superconductor films. More particularly, this invention relates to a liquid phase epitaxial method of growing single crystal films of high temperature oxide superconductors

2. Description of the Related Art

Since the discovery of superconductivity in 1911, the phenomenon of a material being able to conduct electricity with almost no resistance when the material is cooled to a temperature approaching absolute zero (0° K.) has remained an interesting scientific curiosity having few applications which would justify the expense of maintaining the necessary liquid helium cooled system.

Recently, however, superconducting ceramic materials have been produced which exhibit this phenomenon at much higher temperatures, e.g., in some cases even higher than the boiling point of liquid nitrogen which boils at about 77° K. The ability to produce superconductivity, for example, in a material cooled by liquid nitrogen completely changes the economics which have previously restricted the applications to which superconductivity could be applied.

These new ceramic materials are sometimes referred to as multi-layer perovskite compounds because of the crystallography of the resulting structure. One such group of compounds is referred to as 1-2-3 compounds because of the atomic ratios of 1 atom of an element such as a rare-earth (Lanthanum series) element, e.g., lanthanum or yttrium; 2 atoms of another element such as an alkaline earth metal, e.g., barium or strontium; and 3 atoms of a metal such as copper. The superconducting ceramic also contains from 6.5+ to 7- atoms of oxygen which is usually referred to as $O_{(6.5+x)}$ where x is greater than 0 and less than 0.5, resulting in a chemical formula such as, for example, $XY_2Cu_3O_{(6.5+x)}$, where X represent the first element, e.g., a rare earth; and Y represents the second element, e.g., an alkaline earth metal.

Other ceramic compounds exhibiting such superconductivity are bismuth-strontium-calcium-copper-oxygen, thallium-calcium-barium-copper-oxygen, bismuth-strontium-calcium-lead copper-oxygen, bismuth-strontium-lead-copper-oxygen, and thallium-calcium-barium-lead-copper-oxygen compounds. Another example of a superconducting ceramic, where copper is omitted, is a barium-potassium-bismuth-oxygen compound.

The prevalent method which has been described in the literature to produce this type of superconducting ceramic is to mechanically mix powders of the oxides or carbonates of the respective rare earth, alkaline earth metal, and copper elements in the 1-2-3 structure of the superconductor, calcine the mixture to remove water or other volatiles, and then fire the powder mixture in an oxygen atmosphere at a temperature sufficiently high to produce the desired superconducting phase.

Such methods have been adequate to form ceramic blocks or masses of superconducting material to verify the formation of superconducting materials for purposes of scientific exploration. However, for the formation of useful materials such as, for example, thin films of superconducting material for use in an integrated circuit structure, it would be desirable to form single crystal films of such superconductors, preferably with the growth of the single crystal oriented to provide superconductivity along one or both axes or the plane of the film.

Hiskes, in an article entitled "LPE GROWTH AND CHARACTERIZATION OF MAGNETIC GARNETS GROWN IN BaO-BASED SOLVENTS", published in the Journal of Crystal Growth, 27, (1974) at pp. 287-298, described the growth of magnetic garnets such as $Sm_{0.3}Y_{2.7}Ga_{1.2}Fe_{3.8}O_{12}$ from a ternary solvent of $BaO-B_2O_3-BaF_2$ on a $Gd_3Ga_5O_{12}$ substrate.

It would be desirable to produce epitaxial films of superconductors using a liquid phase growth method to produce such films on a substrate, particularly if crystal growth could be made to occur in an oriented direction by orientation of the substrate on which the epitaxial growth occurs.

SUMMARY OF THE INVENTION

It is, therefore, an object of this invention to provide a method for the epitaxial growth of single crystal films of a superconducting material from a liquid solvent.

It is another object of this invention to provide a method for the epitaxial growth of single crystal films of a superconducting material from a liquid solvent on an oriented substrate.

It is yet another object of this invention to provide a method for the epitaxial growth of single crystal films of a superconducting material from a liquid solvent on an oriented substrate of an insulating material.

BRIEF DESCRIPTION OF THE DRAWINGS

The sole drawing is a flow sheet illustrating the process of the invention.

DETAILED DESCRIPTION OF THE INVENTION

The invention provides a method for producing thin films of superconducting material by epitaxial growth on a substrate from a liquid phase solution. Preferably, the substrate is oriented to provide crystal growth of the superconductor in a direction which will favor superconducting flow along an axis of the epitaxially grown thin film. Most preferably, the substrate on which the superconducting thin film is grown also comprises an insulating material, which preferably has a dielectric constant below about 20.

The solution from which the superconducting thin film is epitaxially grown comprises the compounds from which the superconducting material will be grown dissolved in a solvent which preferably comprises an oxide-based solvent due to the need for oxygen in the thin film superconducting crystal to be grown therefrom. In a particularly preferred embodiment, the solvent comprises a mixture of barium oxide, boron oxide, and barium fluoride. The ratios of the three main components of the solvent vary from about 40 to about 50 wt. % BaO, about 25 to about 50 wt. % $B_2O_3$, and about 12 to about 25 wt. % $BaF_2$. Preferably, the ratios of the solvent components are from about 41 to about 48 wt. % BaO, about 30 to about 45 wt. % $B_2O_3$, and about 14 to about 23 wt. % $BaF_2$. Most preferably, the ratios of the solvent components vary from about 43 to about 48 wt. % BaO, about 31 to about 41 wt. % $B_2O_3$, and about 16 to about 22 wt. % $BaF_2$.

A typical solvent composition comprises about 47.6 wt. % BaO, about 31 wt. % $B_2O_3$, and about 21.4 wt. % $BaF_2$ or about 43 wt. % BaO, about 41 wt. % $B_2O_3$, and about 16 wt. % $BaF_2$.

Other solvent materials, such as $BaCl_2$, are be used provided that they lower the viscosity of the melt to less than 20 centipoise, i.e., less than the viscosity of the ternary solvent, and that they be capable of not volatilizing or decomposing at the temperature used during the epitaxial growth, i.e., a low vapor pressure solvent at the epitaxial crystal growth temperature.

The barium oxide/boron oxide/barium fluoride solvent of the preferred embodiment is formed by slowly decomposing $BaCO_3$ in situ with dry $B_2O_3$ at about 1100°–°200° C. to avoid excess frothing, and then adding $BaF_2$ and melting at 1200° C.

In accordance with the invention, oxides or mixtures of oxides and fluorides of the elements, from which will be epitaxially grown the single crystal films of the superconductor, are dissolved in the solvent to form a solution which is maintained at a temperature of from about 400° to about 1000° C., depending upon the saturation point of the solute in the solution. The amount of each compound dissolved in the solvent depends upon the desired stoichiometry of the superconductor crystals to be grown from the solution or melt.

For example, for a 1-2-3 or perovskite type superconductor structure such as the now well known superconductors $YBa_2Cu_3O_7$ or $YBa_2Cu_3O_{(6.5+x)}$ where x is greater than 0 and less than 0.5; 1 mole of yttrium oxide ($Y_2O_3$) is dissolved per 4 moles of barium oxide (BaO) and 6 moles of cupric oxide (CuO) or 3 moles of cuprous oxide ($Cu_2O$).

The above mentioned Y-Ba-Cu-O superconductors form part of the class of 1-2-3 or perovskite superconductors which are formed into thin films in accordance with the invention and which have the general formula $RM_2CU_3O_{(6.5+x)}$ where x is less than 0.5 and more than 0; R is one or more rare earth elements selected from the class consisting of scandium, yttrium, and any of the lanthanide series of rare earths, including lanthanum, neodymium, promethium, samarium, europium, gadolinium, terbium, dysprosium, holmium, erbium, thulium, ytterbium, and lutetium with the possible exceptions of cerium and praseodymium which have not, to date, been successfully used in forming superconducting materials; and M is lead or one or more alkaline earth elements selected from the class consisting of Ba, Ca, and Sr.

Examples of other superconductor thin films which are epitaxially grown in accordance with the invention include Bi-Sr-Ca-Cu-O superconductors having the formula $Bi_2Sr_2Ca_{n-1}Cu_nO_{2n+4+m}$ or $BiSr_2Ca_{n-1}Cu_nO_{2n+3+m}$ where n=1 to 5 and m=0 to 1; Tl-Ba-Ca-Cu-O superconductors having the formula $Tl_2Ba_2Ca_{n-1}Cu_nO_{2n+4+m}$ or $TlBa_2Ca_{n-1}Cu_nO_{2n+3+m}$ where n=1 to 5 and m=0 to 1; and Ba-K-Bi-O superconductors having the formula $Ba_{0.6}K_{0.4}BiO_3$.

In accordance with the invention, a portion of the oxides of the superconductor elements dissolved in the solvent may be replaced by a fluoride or chloride of the element, e.g., cuprous fluoride (CuF), or barium fluoride ($BaF_2$), or yttrium chloride ($YCl_2$) to act as a flux to reduce the viscosity of the melt.

The total amount of the materials to be dissolved in the solvent depends upon the solubility limits in the multicomponent phase diagram as a function of temperature and solution composition. In general, the higher the growth temperature, the more solute can be dissolved, from 1–2 percent at 500° C. up to 20 percent or more at temperatures greater than 900° C. Once an appropriate growth temperature is selected, enough solute is dissolved in the solvent to reach saturation. The solution then is heated above this saturation temperature and vigorously stirred to ensure that all solute is dissolved. The solution is then cooled below the saturation temperature a few degrees. The solution is kept quiescent so that, a metastable state of supersaturated liquid can be maintained for a period of hours, during which time an appropriate substrate is immersed in the supersaturated liquid. The substrate acts as a template for heterogeneous nucleation of the appropriate superconducting phase, and growth of a thin film proceeds by diffusion of solute species through a diffusion boundary layer adjacent to the growing interface. The bulk of the liquid acts as an infinite solute sink to maintain a quasisteady state saturation condition to assure constant growth rate of the film until growth is stopped by removing the substrate from the solution.

It is also within the scope of the invention to optionally add to the melt other fluxing agents such as alkali metal halides, e.g., NaF, and KF, $BaCl_2$, and KCl, to reduce the viscosity of the melt to permit easier growth of the thin film crystals at temperatures below 950° C. Such compounds also help to break up the boron oxide polymeric chains and to adjust the anion composition in the crystal. Such additional fluxing agents are added in an amount of not greater than 10 wt. %, based upon the total weight of the solvent.

The temperature of the solution during growth of the thin films is preferably maintained at from about 400° to about 1000° C., depending upon the viscosity of the solvent and the particular superconductor material being epitaxially grown. This temperature must be below the melting point of the seed or substrate upon which the thin film will be grown and should be a few degrees below the saturation temperature of the solution.

In accordance with the invention, growth of the thin film superconductor crystal is commenced by lowering into the molten solution a seed substrate upon which the single crystal thin film superconductor is epitaxially grown. In a preferred embodiment, the substrate or seed material also comprises a superconducting material. An example of such a seed crystal is a $YBa_2Cu_3O_7$ substrate when the crystal being grown is a Bi-Sr-Ca-Cu crystal since $YBa_2Cu_3O_7$ has a higher melting point than a Bi-Sr-Ca-Cu crystal.

Other examples of substrates or seed include $SrTiO_3$, $BaF_2$, $CaF_2$, $ZrO_2$, MgO, $LaAlO_3$, $LaGaO_3$, $LiNbO_3$, or other suitable dielectric materials.

Preferably a seed crystal or substrate is used having a crystal orientation which will promote crystal growth in a predetermined direction wherein one or more of the axes of the epitaxially grown thin film superconductor along which superconducting current is known to flow will be grown on the substrate in the direction of intended or desired current flow along the substrate. The thickness of the epitaxially grown thin film superconductor is a function of the amount of time the substrate is immersed in the molten solution. For example, for a film thickness of 10 microns, the substrate is immersed in the melt for a period of about 1–60 minutes. Usually the epitaxial growth is carried out for a period of from about 0.1 to about 2 hours to grow thin films ranging in thickness of from about 500 Angstroms to about 20 microns.

During the epitaxial growth of the thin film, the substrate is advantageously slowly rotated in the molten solution to provide uniformity of growth and to avoid any local starvation or inhomogeneous deposition of the thin film on the substrate. The substrate is preferably rotated at a rate of from about 10 to about 100 rotations per minute.

In accordance with one aspect of the process of the invention, to maintain a sufficient amount of oxygen available for forming the desired oxide-containing superconducting crystal lattice, it is also desirable to bubble a source of oxygen through the melt while epitaxially growing the thin film crystals. This is accomplished, for example, by bubbling $O_2$ or $O_3$ though the melt during the epitaxial crystal growth.

As a further illustration of the invention, a thin film superconductor crystal of Bi-Sr-Ca-Cu-O, having the formula $Bi_2Sr_2Ca_2Cu_3O_{10}$, may be grown on a $YBa_2Cu_3O_7$ substrate or support surface by first forming a solvent consisting essentially of about 1 Kg of a $BaO/B_2O_3/BaF_2$ solvent consisting essentially of about 43 wt. % BaO, about 41 wt. % $B_2O_3$, and about 16 wt. % $BaF_2$ at a temperature of about 905° C. and then dissolving in the solvent about 17 grams of $Bi_2O_3$, about 43 grams of SrO, about 109 grams of CaO, and about 108 grams of CuO.

A substrate consisting essentially of a $YBa_2Cu_3O_7$ crystal is heated to a temperature of at least about 800 C and then slowly lowered into the melt while a source of preheated oxygen is bubbled through the melt at a rate of 100 cc/minute. The substrate is rotated in the melt at a rate of 50 revolutions/minute for a period of 1 hour and then withdrawn from the melt and allowed to cool in an oxygen atmosphere. The resulting thin film is found to be a single crystal layer of $Bi_2Sr_2Ca_2Cu_3O_{10}$ of about 2 microns thickness.

Thus, the invention provides a method for liquid phase epitaxial growth of a thin film of an oxide-based superconductor from a molten solution on a substrate while maintaining a sufficient source of oxygen present during the crystal growth.

Having thus described the invention, what is claimed is:

1. A method of forming a thin film of an oxide based superconductor which comprises:
   (a) forming an oxide based solvent;
   (b) dissolving in said solvent a stoichiometric amount of compounds capable of forming a superconducting material to form a molten solution;
   (c) immersing a substrate into said resulting molten solution, said substrate having a crystal orientation corresponding to a desired direction of crystal growth of said thin film and having a composition different from said thin film;
   (d) epitaxially growing a thin film of a superconductor crystal on said substrate; and
   (e) bubbling a source of oxygen through said molten solution during said epitaxial growth of said thin film superconductor crystal.

2. The method of claim 1 wherein said step of forming said molten solution of said oxide based solvent and said compounds capable of forming said superconductor further includes maintaining said molten solution at a temperature of from about 400° to about 1000° C.

3. The method of claim 1 wherein said step of immersing a substrate into said molten solution further comprises immersing a substrate of superconducting material into said molten solution.

4. The method of claim 1 wherein said substrate consists essentially of an insulating material.

5. The method of claim 2 wherein said temperature of said solution is maintained at from about 1 to 2 degrees below the saturation point of the compounds dissolved in said solvent.

6. The method of claim 3 wherein said superconductor substrate consists essentially of a $YBa_2Cu_3O_{(6.5+x)}$ crystal, where x is greater than 0 and less than 0.5.

7. A method of forming a thin film of an oxide based superconductor which comprises:
   (a) forming an oxide based solvent;
   (b) dissolving in said solvent a stoichiometric amount of compounds capable of forming a superconducting material to form a molten solution;
   (c) maintaining said molten solution at a temperature of from about 400° to about 1000° C.;
   (d) immersing a substrate into said resulting molten solution, said substrate having a crystal orientation corresponding to a desired direction and orientation of crystal growth of said thin film, and having a composition different from said thin film;
   (e) epitaxially growing a thin film of a superconductor crystal on said substrate; and
   (e) bubbling a source of oxygen through said molten solution during said epitaxial growth of said thin film superconductor crystal.

8. The method of claim 7 wherein said oxygen is bubbled through said molten solution at a rate of from about 10 to about 1000 cc per minute per liter of molten solution.

9. The method of claim 7 wherein said oxide-based solvent comprises from about 40 to about 50 wt. % BaO, from about 25 to about 50 wt. % $B_2O_3$, and from about 12 to about 25 wt. % $BaF_2$, with the balance consisting essentially of from 0 to about 10 wt. % of one or more fluxing agents.

10. The method of claim 7 wherein said step of epitaxially growing said thin film of said superconductor crystal further comprises rotating said substrate in said molten bath at a rate of from about 25 to about 200 revolutions per minute during said epitaxial growth.

11. The method of claim 7 wherein said superconductor substrate is immersed in said molten solution for a period of from about 10 seconds to about 2 hours to epitaxially grow a thin film of said superconductor crystal on said superconductor substrate of from about 500 Angstroms to about 10 microns thickness.

12. The method of claim 7 wherein said step of dissolving in said oxide based solvent a stoichiometric amount of compounds capable of forming a superconducting material to form a molten solution further comprises dissolving an oxide or a halide of one or more rare earths, an oxide or a halide of one or more alkaline earth metals, and an oxide or a halide of copper in said solvent.

13. The method of claim 7 wherein said step of dissolving in said oxide based solvent a stoichiometric amount of compounds capable of forming a superconducting material to form a molten solution further comprises dissolving an oxide or a halide of one or more rare earths selected from the class consisting of scandium, yttrium, lanthanum, neodymium, promethium, samarium, europium, gadolinium, terbium, dysprosium, holmium, erbium, thulium, ytterbium, and lutetium; an oxide or a halide of one or more alkaline earth metals selected from the class consisting of barium, calcium, and strontium; and an oxide or a halide of copper in said solvent.

14. The method of claim 7 wherein said step of dissolving in said oxide based solvent a stoichiometric amount of compounds capable of forming a superconducting material to form a molten solution further comprises dissolving an oxide or a halide of bismuth; an oxide or a halide of one or more alkaline earth metals; and an oxide or a halide of copper in said solvent.

15. The method of claim 7 wherein said step of dissolving in said oxide based solvent a stoichiometric amount of compounds capable of forming a superconducting material to form a molten solution further comprises dissolving an oxide or a halide of thallium; an oxide or a halide of one or more alkaline earth metals; and an oxide or a halide of copper in said solvent.

16. The method of claim 7 wherein said step of dissolving in said oxide based solvent a stoichiometric amount of compounds capable of forming a superconducting material to form a molten solution further comprises dissolving an oxide or a halide of thallium; an oxide or a halide of one or more alkaline earth metals; an oxide or a halide of lead; and an oxide or a halide of copper in said solvent.

17. The method of claim 7 wherein said step of dissolving in said oxide based solvent a stoichiometric amount of compounds capable of forming a superconducting material to form a molten solution further comprises dissolving an oxide or a halide of bismuth; an oxide or a halide of an alkali metal; an oxide or halide of lead; an oxide or fluoride of an alkaline earth metal; and an oxide or a halide of copper in said solvent.

18. The method of claim 7 wherein said stoichiometric amount of said compounds are dissolved in said solvent in an amount sufficient to saturate said resulting solution.

19. The method of claim 8 wherein said oxide-based solvent comprises from about 41 to about 48 wt. % BaO, from about 30 to about 45 wt. % $B_2O_3$, and from about 14 to about 23 wt. % $BaF_2$.

20. The method of claim 8 wherein said oxide-based solvent comprises from about 43 to about 48 wt. % BaO, from about 31 to about 41 wt. % $B_2O_3$, and from about 16 to about 22 wt. % $BaF_2$.

21. The method of claim 8 wherein said oxide-based solvent comprises about 47.6 wt. % BaO, about 31 wt. % $B_2O_3$, and about 21.4 wt. % $BaF_2$.

22. The method of claim 8 wherein said oxide-based solvent comprises about 43 wt. % BaO, about 41 wt. % $B_2O_3$, and about 16 wt. % $BaF_2$.

23. A method of forming a thin film of an oxide based superconductor which comprises:
(a) forming an oxide based solvent comprising from about 40 to about 50 wt. % BaO, from about 25 to about 50 wt. % $B_2O_3$, and from about 12 to about 25 wt. % $BaF_2$, with the balance consisting essentially of from about 0 to about 10 wt. % of one or more fluxing agents;
(b) dissolving in said solvent a stoichiometric amount of compounds capable of forming a superconducting material to form a molten solution;
(c) maintaining said molten solution at a temperature of from about 400° to about 1000° C.
(d) immersing into said molten solution for a period of from about 10 seconds to about 2 hours of substrate of superconducting material having a crystal orientation corresponding to a desired direction and orientation of crystal growth of said thin film, said substrate having a composition different from said thin film;
(e) rotating said substrate in said bath at a rate of from about 25 to about 500 revolutions per minute;
(f) epitaxially growing a thin film of a superconductor crystal on said superconductor substrate of from about 500 Angstroms to about 10 microns thickness; and
(g) bubbling a source of oxygen through said molten solution during said epitaxial growth of said thin film superconductor crystal.

* * * * *